(12) United States Patent
Hayahi et al.

(10) Patent No.: US 10,469,641 B2
(45) Date of Patent: Nov. 5, 2019

(54) STAND FOR MOBILE TERMINAL

(71) Applicant: NEC Platforms, Ltd., Kawasaki-shi, Kanagawa (JP)

(72) Inventors: Manabu Hayahi, Kanagawa (JP); Katsutoshi Hayashi, Kanagawa (JP)

(73) Assignee: NEC Platforms, Ltd., Kanagawa-shi, Kanagawa (JP)

( * ) Notice: Subject to any disclaimer, the term of this patent is extended or adjusted under 35 U.S.C. 154(b) by 0 days.

(21) Appl. No.: 16/178,721

(22) Filed: Nov. 2, 2018

(65) Prior Publication Data

US 2019/0166240 A1 May 30, 2019

(30) Foreign Application Priority Data

Nov. 28, 2017 (JP) ................. 2017-227659

(51) Int. Cl.
*H04M 1/04* (2006.01)
*H05K 5/02* (2006.01)
*H04M 1/725* (2006.01)
*H05K 5/00* (2006.01)

(52) U.S. Cl.
CPC ............. *H04M 1/04* (2013.01); *H04M 1/725* (2013.01); *H05K 5/00* (2013.01); *H05K 5/023* (2013.01); *H05K 5/0217* (2013.01); *H05K 5/0234* (2013.01)

(58) Field of Classification Search
CPC .......... H04M 1/04; H04M 1/725; H05K 5/00; H05K 5/0217; H05K 5/023; H05K 5/0234
See application file for complete search history.

(56) References Cited

U.S. PATENT DOCUMENTS

| | | | | |
|---|---|---|---|---|
| 9,267,638 | B2 * | 2/2016 | Le Gette | F16M 11/04 |
| D794,007 | S * | 8/2017 | Zhang | D14/250 |
| D817,316 | S * | 5/2018 | Srour | D14/251 |
| D830,367 | S * | 10/2018 | Chang | D14/440 |
| D835,624 | S * | 12/2018 | Li | D14/440 |
| 10,211,875 | B1 * | 2/2019 | Glass, Jr. | H04B 1/3888 |
| D849,011 | S * | 5/2019 | Pang | D14/440 |
| D851,092 | S * | 6/2019 | Tan | D14/440 |

(Continued)

FOREIGN PATENT DOCUMENTS

| JP | 2013-165521 A | 8/2013 |
|---|---|---|
| JP | 6198093 B1 | 9/2017 |

OTHER PUBLICATIONS

Notification of Reason for Refusal for corresponding JP 2017-227659, dated Jan. 10, 2018.

*Primary Examiner* — Devan A Sandiford
(74) *Attorney, Agent, or Firm* — Sughrue Mion, PLLC

(57) ABSTRACT

A stand for a mobile terminal according to this invention includes a placement portion having a plate-like shape and a front surface on which a mobile terminal is placed under a state in which a shoulder belt is attached to the mobile terminal, a support portion (a support leg portion and a brace portions) configured to support the placement portion so that the mobile terminal is placed on the placement portion under a backwardly inclined state, and a shoulder belt holding portion, which is formed on a rear surface of the placement portion and has a holding space portion having a shape recessed in a direction toward a lower side of the placement portion to place at least part of the shoulder belt for the mobile terminal placed on the placement portion) therein.

20 Claims, 14 Drawing Sheets

(56) References Cited

U.S. PATENT DOCUMENTS

| | | | | |
|---|---|---|---|---|
| 2002/0044406 A1* | 4/2002 | Shimoda | G06F 1/1626 | 361/679.02 |
| 2006/0076381 A1* | 4/2006 | Elizalde Rodarte | A45F 5/00 | 224/600 |
| 2007/0099681 A1* | 5/2007 | Kielland | A45F 5/02 | 455/575.1 |
| 2011/0297711 A1* | 12/2011 | Yu | A45F 5/00 | 224/272 |
| 2012/0063066 A1* | 3/2012 | Floit | A45F 3/14 | 361/679.01 |
| 2012/0097831 A1* | 4/2012 | Olukotun | F16M 11/041 | 248/688 |
| 2012/0190413 A1* | 7/2012 | Ojeda | A45F 5/021 | 455/575.8 |
| 2012/0199501 A1* | 8/2012 | Le Gette | F16M 11/04 | 206/45.24 |
| 2014/0042294 A1* | 2/2014 | Marzynski | A45F 5/00 | 248/693 |
| 2014/0049060 A1* | 2/2014 | Rayner | A45F 5/10 | 294/25 |
| 2014/0085814 A1* | 3/2014 | Kielland | A45F 3/02 | 361/679.55 |
| 2014/0152034 A1* | 6/2014 | Tussy | F16M 13/04 | 294/142 |
| 2014/0166658 A1* | 6/2014 | Hamra | A45F 5/00 | 220/500 |
| 2015/0011265 A1* | 1/2015 | Walsh, Jr. | G06Q 20/381 | 455/569.1 |
| 2015/0195392 A1* | 7/2015 | Nissenbaum | H04M 1/04 | 455/569.1 |
| 2015/0201743 A1* | 7/2015 | Erickson-Davis | A45F 5/00 | 224/218 |
| 2015/0208789 A1* | 7/2015 | Pylkovas | A45F 3/02 | 224/607 |
| 2017/0152990 A1* | 6/2017 | Kielland | A45F 5/00 | |
| 2018/0212638 A1 | 7/2018 | Iwata et al. | | |
| 2018/0307284 A1* | 10/2018 | Saravis | H05K 7/20172 | |

* cited by examiner

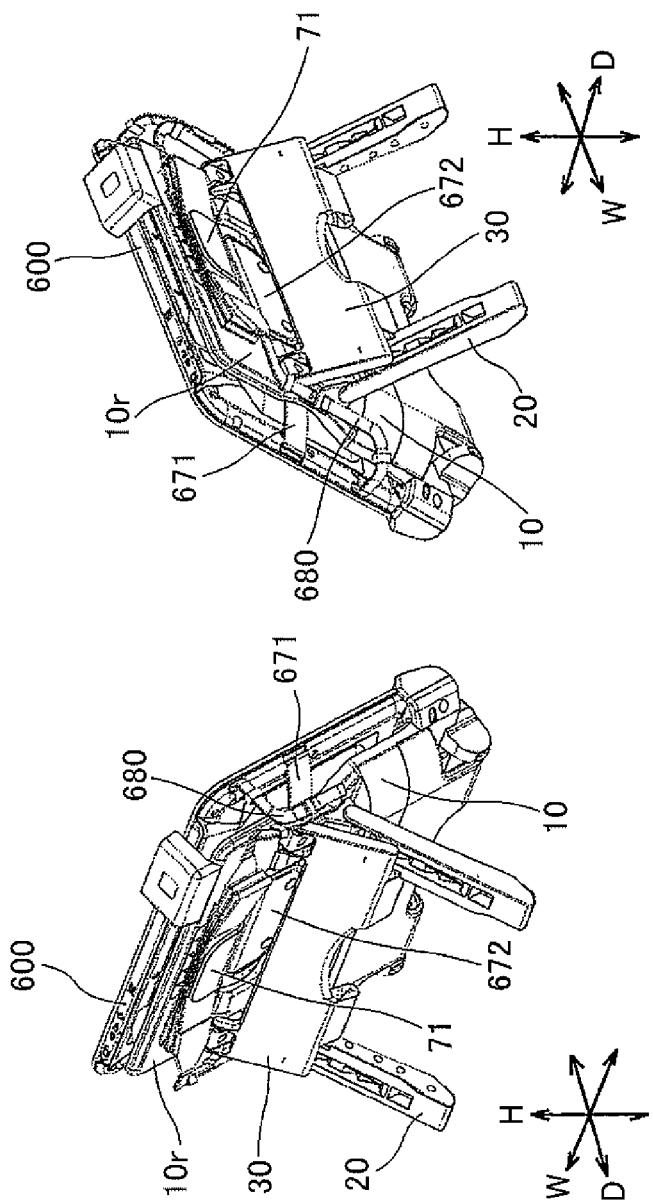

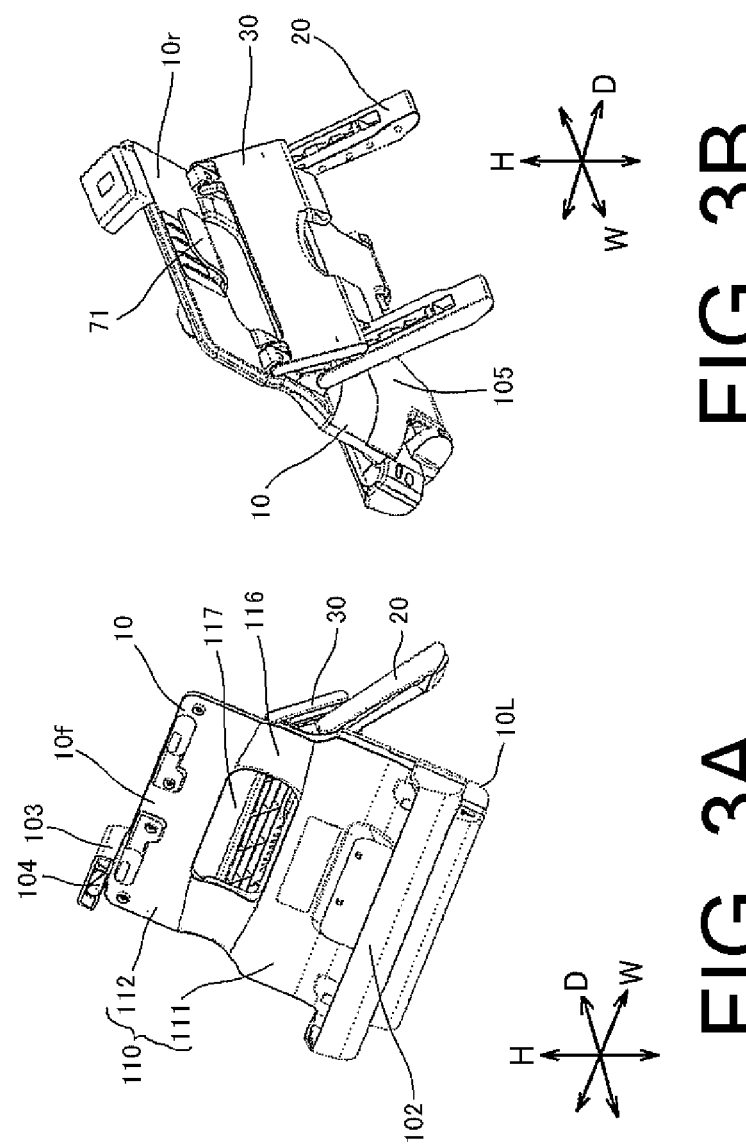

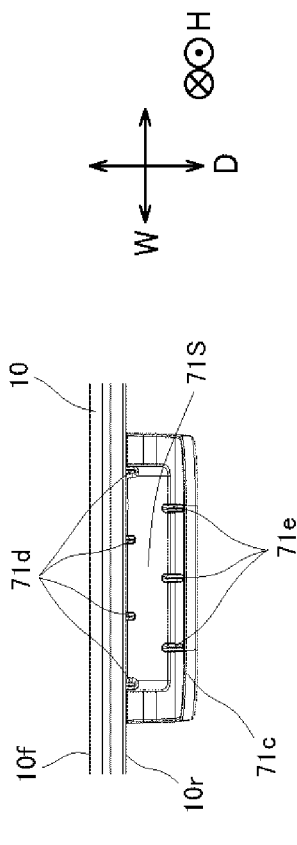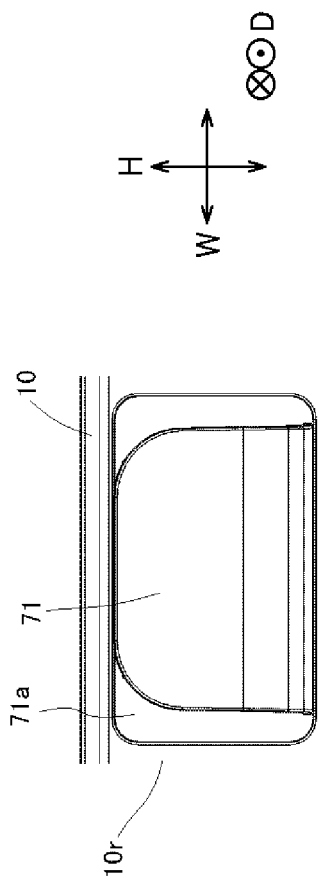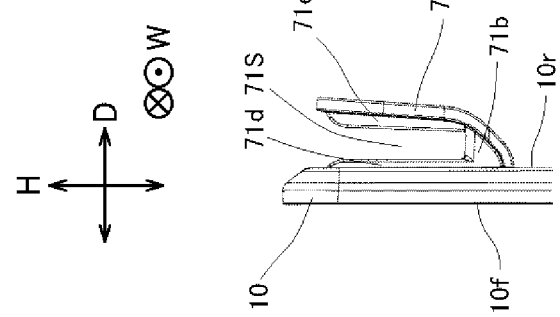

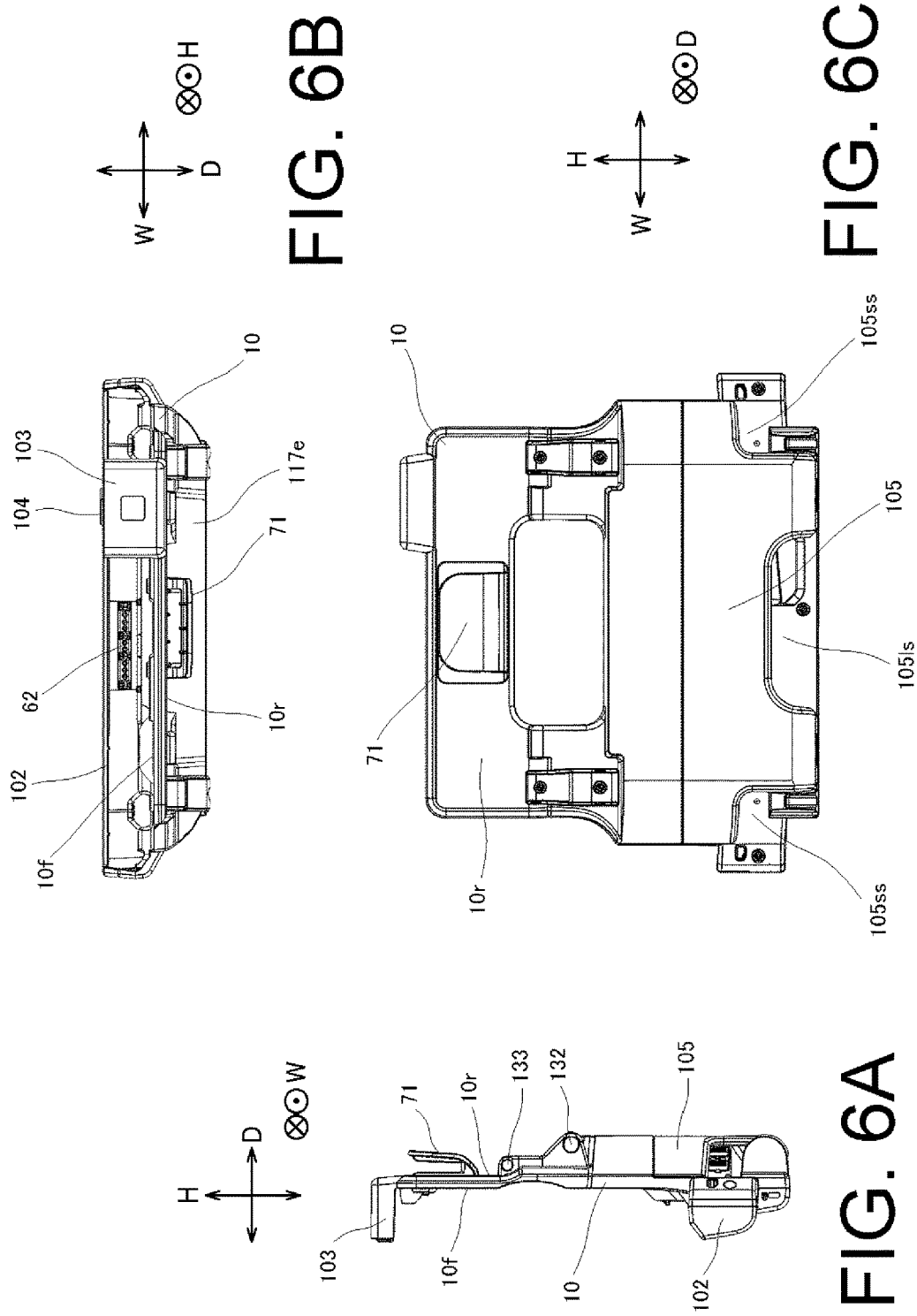

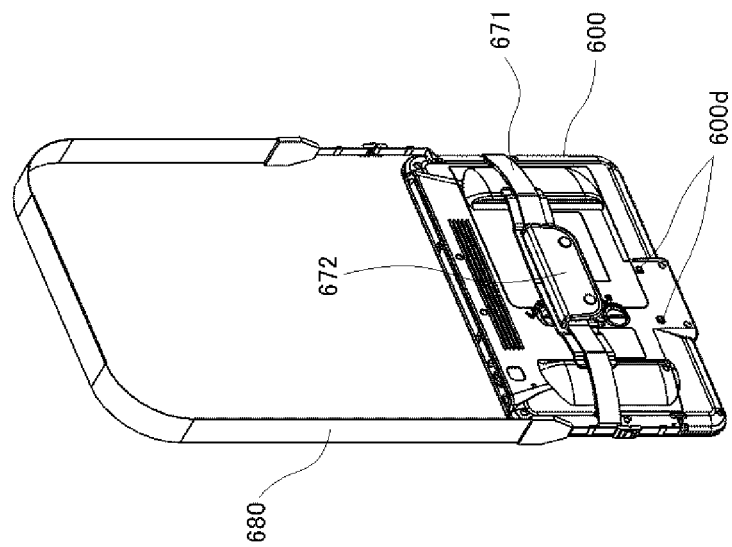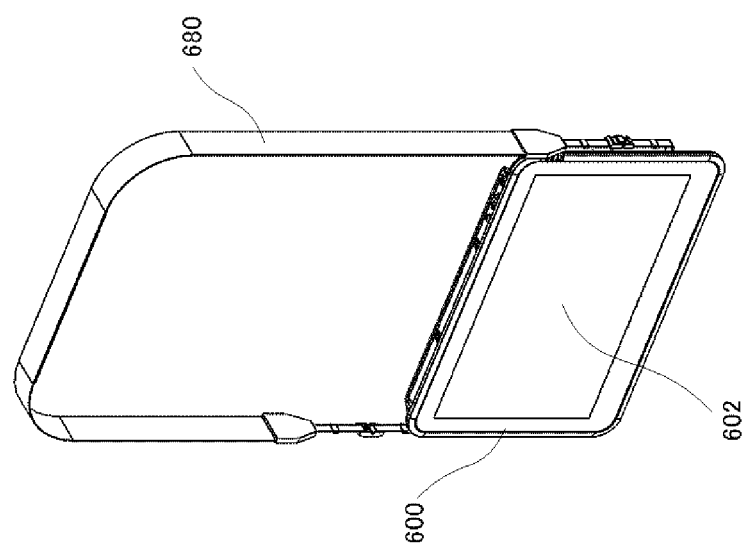

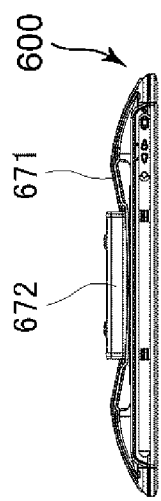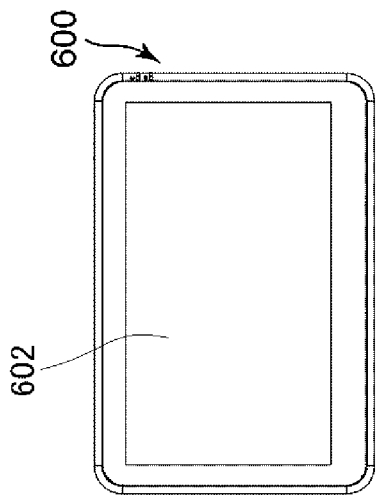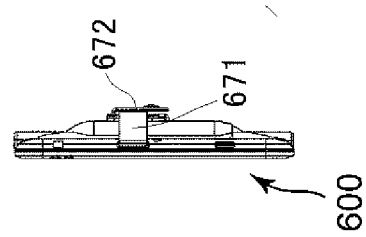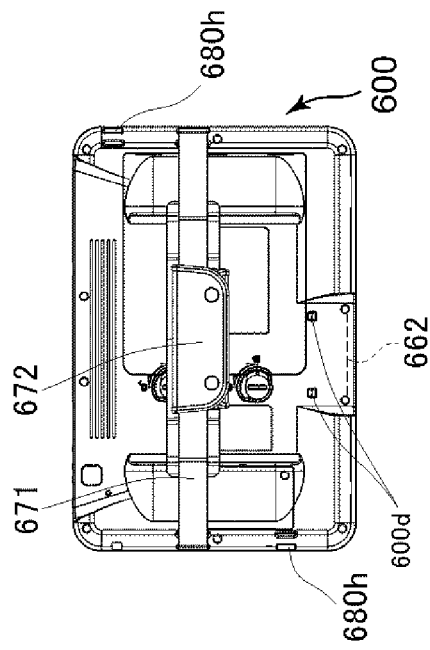

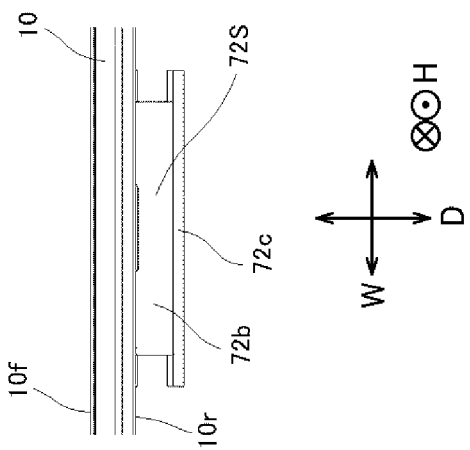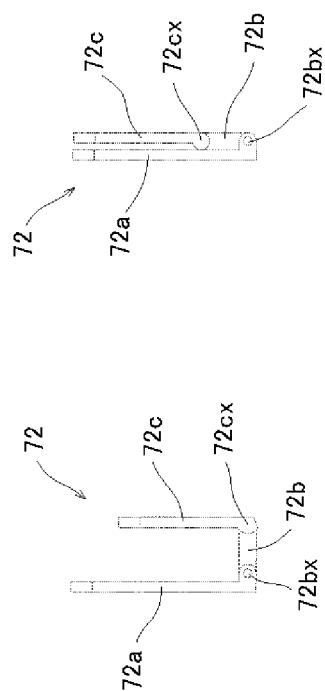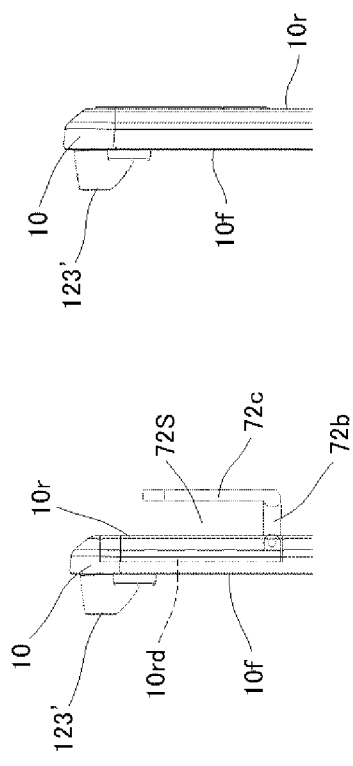

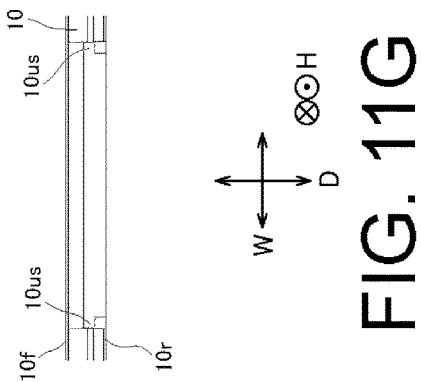
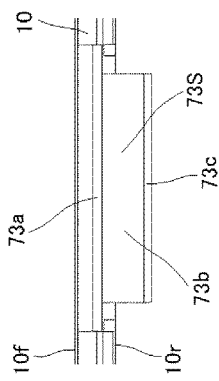
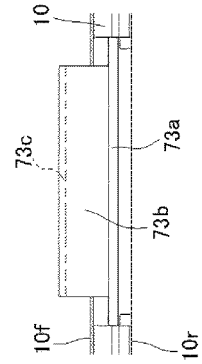
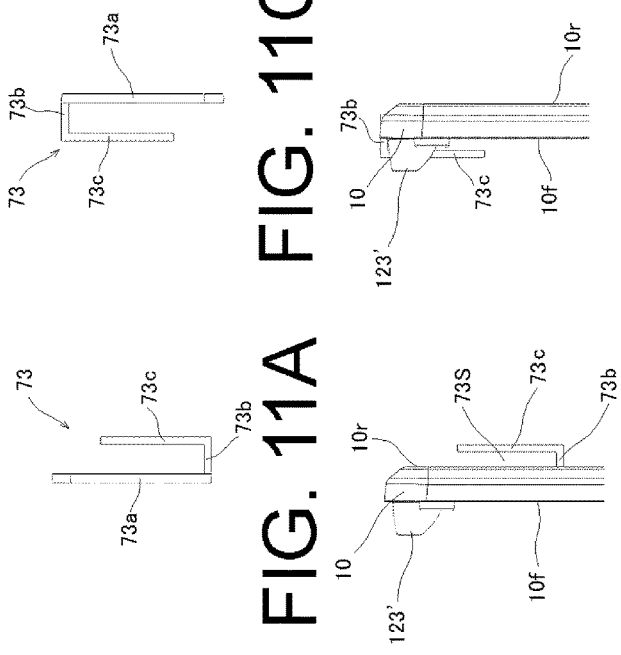
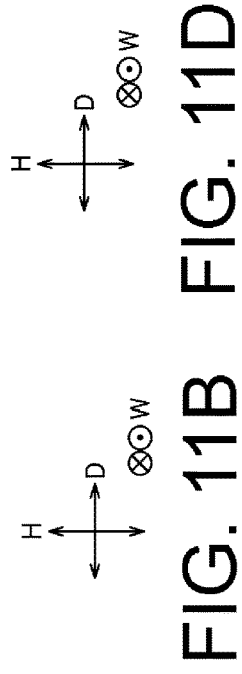

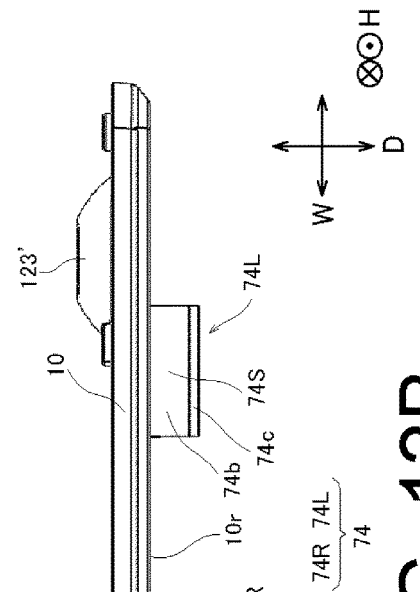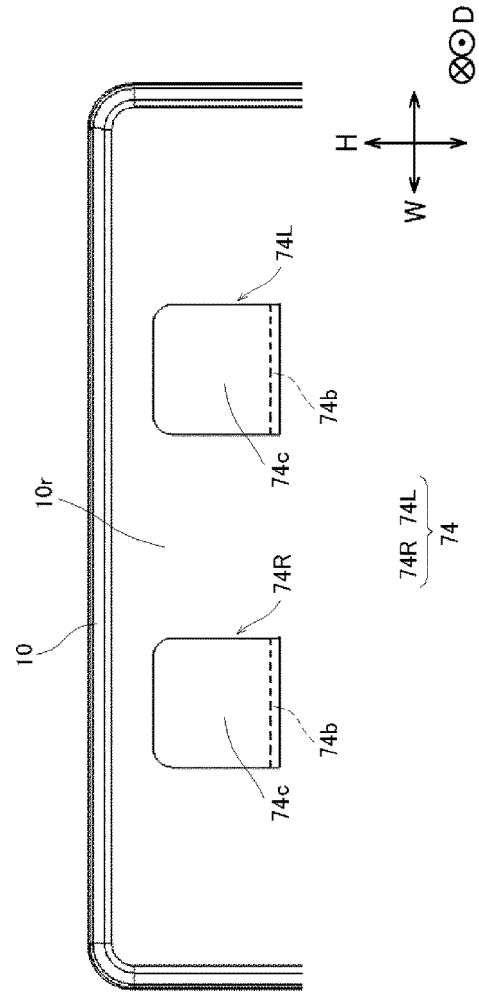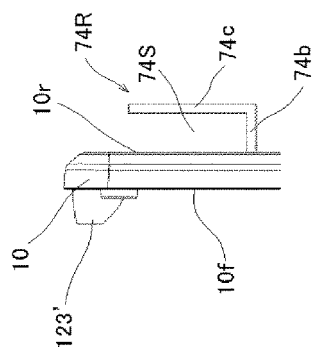

STAND FOR MOBILE TERMINAL

This application is based upon and claims the benefit of priority from Japanese patent application No. 2017-227659, filed on Nov. 28, 2017, the disclosure of which is incorporated herein in its entirety by reference.

BACKGROUND OF THE INVENTION

1. Field of the Invention

This invention relates to a stand for a mobile terminal, which is configured to support a mobile terminal under a backwardly inclined state.

2. Description of the Related Art

As a mobile terminal, which is one kind of portable electronic devices, there is given, for example, a tablet-type point-of-sales (POS) terminal device to be used for a POS system. This kind of mobile terminal includes an input/output device (user interface) such as a display with a touch panel in many cases.

In a case in which the mobile terminal described above is used on a table, a stand configured to support the mobile terminal under a backwardly inclined state is sometimes used. This kind of stand is disclosed in, for example, Japanese Patent JP 6198093 B. The stand disclosed in JP 6198093 B can support the mobile terminal while the display with a touch panel or other input/output devices is oriented in such a direction that ease of visibility of a screen is provided to a user and a touch operation is facilitated. The user uses the mobile terminal in a state of being placed on the stand, for example, in the following manner. The user touches the touch panel to perform an input and views a result of processing on the display. The stand disclosed in JP 6198093 B has a function of charging an internal battery built in the mobile terminal.

Incidentally, in some of the mobile terminals of this type, a shoulder belt to be slung over the user's shoulder is attached for anti-drop protection when the mobile terminal is held and used by hand.

To place the mobile terminal on the stand under a state in which the shoulder belt is attached to the mobile terminal, there is required work for adjusting a posture of the shoulder belt, specifically, work for compactly bundling the shoulder belt and holds the bundled shoulder belt so as to prevent the shoulder belt from returning to an original state. More specifically, the work for adjusting the posture of the shoulder belt includes, for example, shortening the shoulder belt with tying, wrapping the bundled shoulder belt with a magic tape (trade mark) or other members, and placing the shoulder belt at a lower position on the stand, at which the shoulder belt does not become obstructing. The reason why the above-mentioned work is required is as follows. The shoulder belt is as long as, for example, about 1 meter. Therefore, a user's hand or arm may be caught by the shoulder belt to knock over the stand to break the mobile terminal, the shoulder belt obstructs viewing of the display with the touch panel or the touch operation on the touch panel, or an appearance thereof becomes undesirable.

However, the work for adjusting the posture of the shoulder belt is burdensome for the user.

The stand disclosed in JP 6198093 B can reliably support the mobile terminal even under a state in which a hand belt is attached on a back surface of the mobile terminal. The hand belt is used with insertion of the user's hand therein. When the mobile terminal is placed on the stand under a state in which the shoulder belt is attached to the mobile terminal, however, the work for adjusting the posture of the shoulder belt is required.

SUMMARY OF THE INVENTION

This invention has been made in view of the problems described above, and has an object to provide a stand capable of reducing a burden on a user in work for adjusting a posture of a shoulder belt when a mobile terminal is placed on the stand under a state in which the shoulder belt is attached to the mobile terminal.

According to an aspect of this invention, there is provided a stand for a mobile terminal, comprising a placement portion having a plate-like shape, including a front surface on which a mobile terminal is to be placed under a state in which a shoulder belt is attached to the mobile terminal and a rear surface on a side opposite to the front surface; a support portion configured to support the placement portion so that the mobile terminal placed on the placement portion is backwardly inclined; and a shoulder belt holding portion, which is provided to the rear surface of the placement portion and has a holding space portion having a shape recessed in a direction toward a lower side of the placement portion so that at least part of the shoulder belt for the mobile terminal placed on the placement portion is placed therein.

The stand for mobile terminal according to this invention is capable of reducing a burden on the user in work for adjusting the posture of the shoulder belt when the mobile terminal is placed on the stand under the state in which the shoulder belt is attached to the mobile terminal.

BRIEF DESCRIPTION OF THE DRAWINGS

FIG. 2A and FIG. 2B are perspective views of the stand for a mobile terminal according to the first embodiment of this invention, in which FIG. 2A is a perspective view as viewed from a left rear side, and FIG. 2B is a perspective view as viewed from a right rear side.

FIG. 3A and FIG. 3B are perspective views of the stand for a mobile terminal according to the first embodiment of this invention, in which FIG. 3A is a perspective view as viewed from the right front side, and FIG. 3B is a perspective view as viewed from the right rear side.

FIG. 4A, FIG. 4B, and FIG. 4C are a right side view a top view and a back view of a shoulder belt holding portion according to the first embodiment of this invention, respectively.

FIG. 6A, FIG. 6B, and FIG. 6C are a right side view, a top view, and a back view of a placement portion and a rear cover according to the first embodiment of this invention, respectively.

FIG. 8A and FIG. 8B are perspective views of a mobile terminal, which being a target to be placed on the stand for a mobile terminal according to the first embodiment of this invention as viewed from the right front side and the right rear side, respectively.

FIG. 9A, FIG. 9B, FIG. 9C, and FIG. 9D are a top view a front view, a right side view, and a back view of the mobile terminal in a state in which a shoulder belt is removed from the mobile terminal.

FIG. 10A is a right side view of a shoulder belt holding portion alone when the shoulder belt holding portion is used, FIG. 10B is a right side view of the shoulder belt holding portion and a main part of a placement portion when the shoulder belt holding portion is used, FIG. 10C is a right side view of the shoulder belt holding portion alone when the shoulder belt holding portion is not used, FIG. 10D is a right side view of the shoulder belt holding portion and the main part of the placement portion when the shoulder belt holding portion is not used, and FIG. 10E is a top view of the shoulder belt holding portion and the main part of the placement portion when the shoulder belt holding portion is used, according to a second embodiment of this invention.

FIG. 11A is a right side view of a shoulder belt holding portion alone when the shoulder belt holding portion is used, FIG. 11B is a right side view of the shoulder belt holding portion and a main part of a placement portion when the shoulder belt holding portion is used, FIG. 11C is a right side view of the shoulder belt holding portion alone when the shoulder belt holding portion is not used, FIG. 11D is a right side view of the shoulder belt holding portion and the main part of the placement portion when the shoulder belt holding portion is not used, FIG. 11E is a top view of the shoulder belt holding portion and the main part of the placement portion when the shoulder belt holding portion is used, FIG. 11F is a top view of the shoulder belt holding portion and the main part of the placement portion when the shoulder belt holding portion is not used, and FIG. 11G is a top view of the main part of the placement portion, according to a third embodiment of this invention.

FIG. 12A, FIG. 12B, and FIG. 12C are a right side view, a top view, and a back view of a shoulder belt holding portion according to a fourth embodiment of this invention, respectively.

DESCRIPTION OF THE EMBODIMENTS

Figure 1:
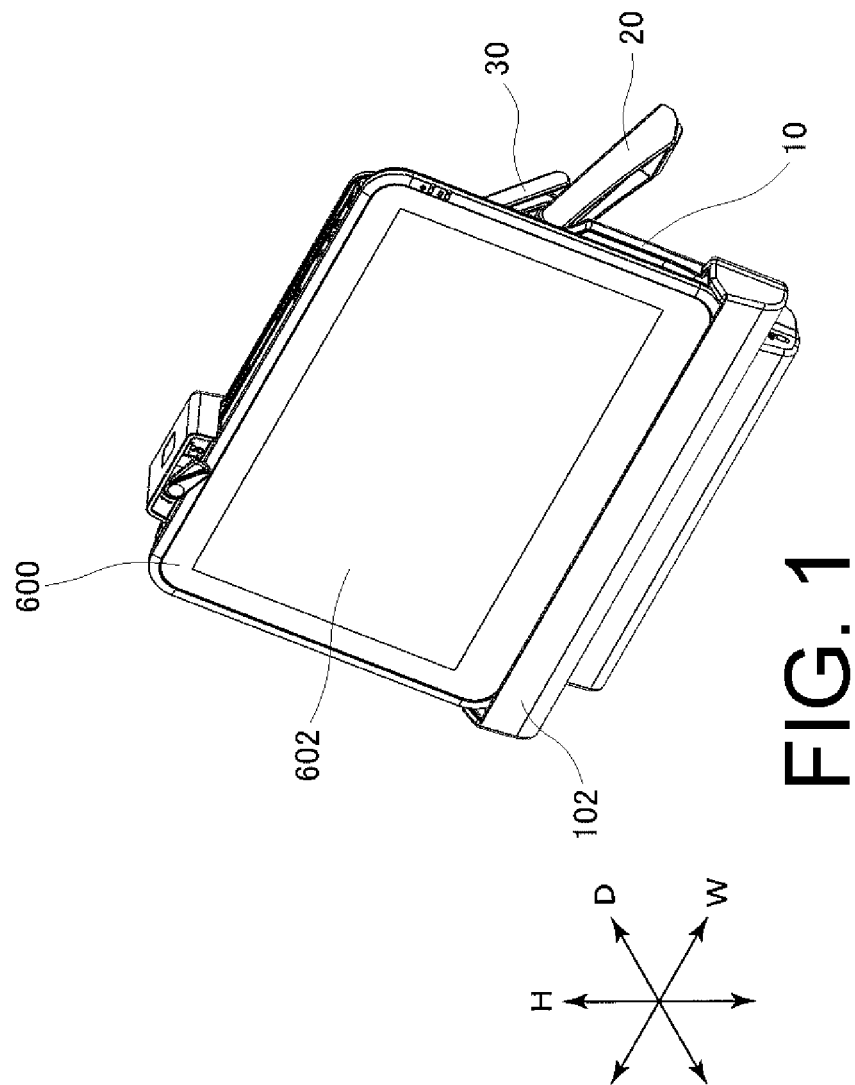
FIG. 1 is a perspective view of a stand for a mobile terminal according to a first embodiment of this invention, as viewed from a right front side.

Now, embodiments of this invention are described with reference to the accompanying drawings. In the following embodiments, a tablet-type POS terminal device to be used for a POS system is described as an example of a mobile terminal.

In the drawings, the arrows with the reference symbols W, H, and D respectively denote a width direction (horizontal direction), a height direction (vertical direction), and a depth direction (fore-and-aft direction) of a stand for a mobile terminal according to the embodiments of this invention.

First, with reference to FIG. 8A, FIG. 8B, and FIG. 9A to FIG. 9D, a mobile terminal (POS terminal device) 600, which is a target to be placed on the stand for a mobile terminal of this invention is described. In FIG. 9A to FIG. 9D, the mobile terminal 600 in a state in which a shoulder belt described later is removed from the mobile terminal 600, is illustrated.

The mobile terminal 600 is of tablet type and includes a display with a touch panel 602 on a front surface. A hand belt 671 and a shoulder belt 680 are attached to the mobile terminal 600. A user inserts a hand into the hand belt 671. The shoulder belt 680 is used to sling the mobile terminal 600 over the user's shoulder. A pad 672 is provided to a center of the hand belt 671. After ends of the shoulder belt 680 are inserted through a pair of through holes 680h (FIG. 9D) formed in a back surface of the mobile terminal 600, the shoulder belt 680 is secured with buckles. In this manner, the shoulder belt 680 is attached to the mobile terminal 600. A length of the shoulder belt 680 from one of the pair of through holes 680h to another one of the through holes 680h is about 1 meter. Contacts 662 for charging and signal input/output, which are electrically connectable to contact pins 62 of the stand for a mobile terminal described later, are provided to a lower end of the mobile terminal 600. The mobile terminal 600 is placed on the stand for a mobile terminal connected to other devices (such as a printer or a customer display portion) an AC adapter to function as the point of sales (POS) terminal device.

First Embodiment

With reference to FIG. 1 to FIG. 7C, a stand for a mobile terminal according to a first embodiment of this invention is described.

Figure 5:
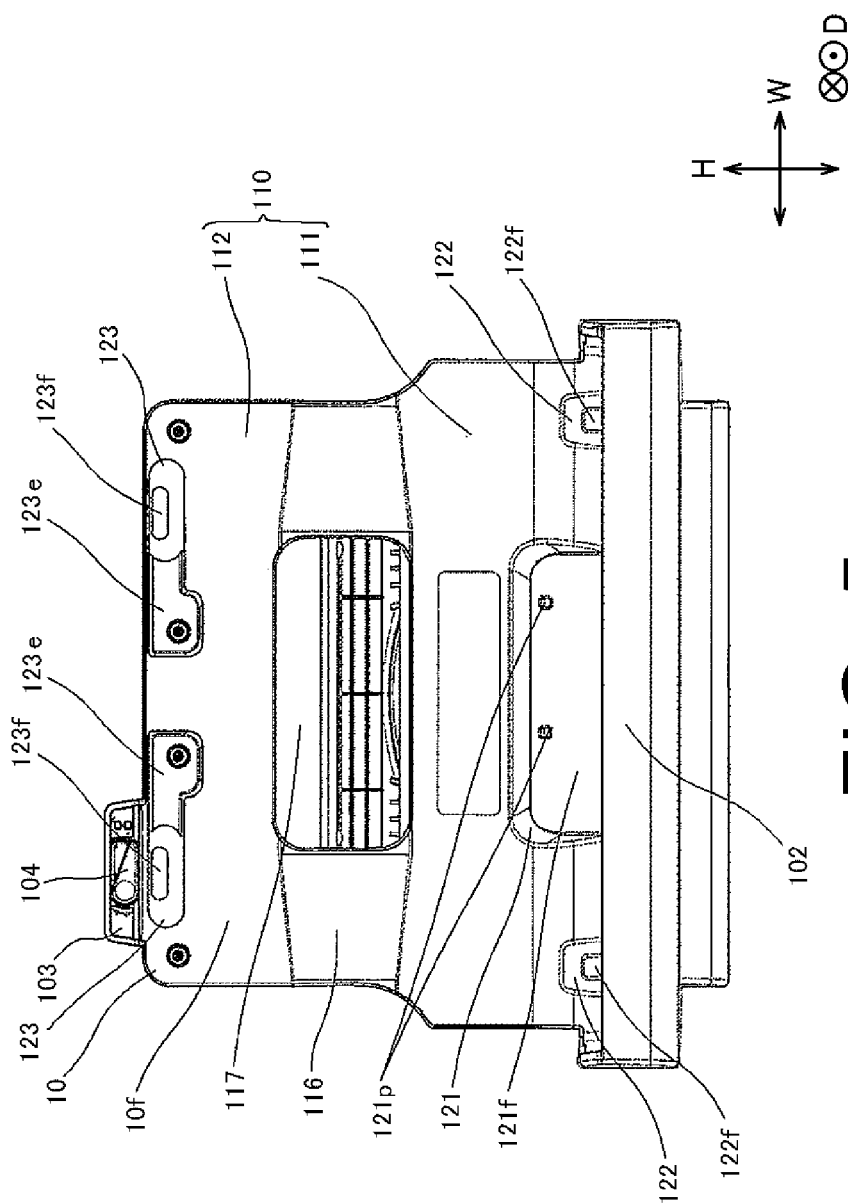
FIG. 5 is a front view of the stand according to the first embodiment of this invention.
Figure 7A:
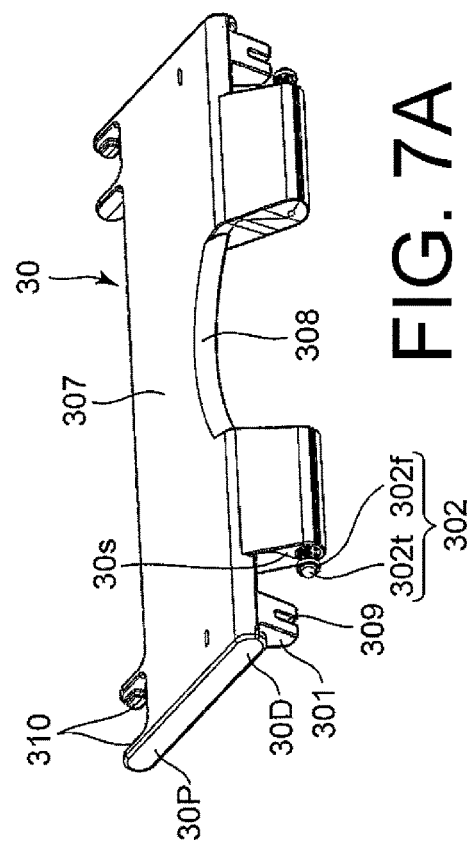
FIG. 7A, FIG. 7B, and FIG. 7C are a perspective view of a pair of brace portion, a perspective view of a pair of support leg portion, and a perspective view of the rear cover according to the first embodiment of this invention, respectively.
Figure 7C:
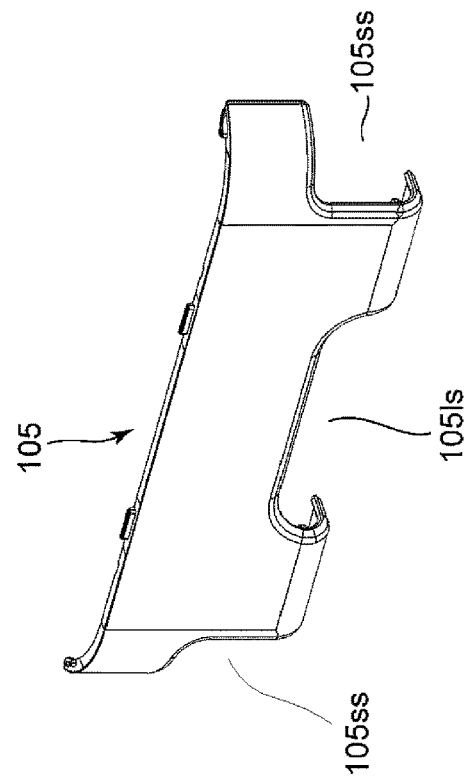
Figure 7B:
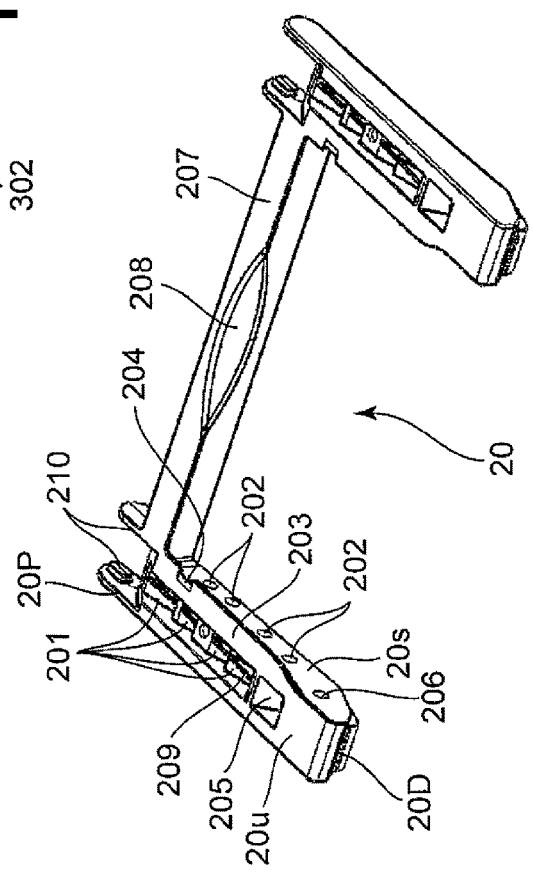

FIG. 1 is a perspective view of a stand on which the mobile terminal 600 is placed, as viewed from a right front side. FIG. 2A is a perspective view of the stand on which the mobile terminal 600 is placed, as viewed from a left rear side. FIG. 2B is a perspective view of the stand on which the mobile terminal 600 is placed, as viewed from a right rear side. FIG. 3A is a perspective view of the stand on which the mobile terminal 600 is not placed, as viewed from the right front side. FIG. 3B is a perspective view of the stand without the mobile terminal 600, as viewed from the right rear side. FIG. 4A, FIG. 4B, and FIG. 4C are a right side view, a top view, and a back view of a shoulder belt holding portion 71, respectively. FIG. 5 is a front view of the stand. FIG. 6A, FIG. 6B, and FIG. 6C are a right side view, a top view, and a back view of a placement portion 10 and a rear cover 105, respectively. FIG. 7A, FIG. 7B, and FIG. 7C are a perspective view of a pair of brace portion 30, a perspective view of a pair of support leg portion 20, and a perspective view of the rear cover 105, respectively.

Referring to FIG. 1 to FIG. 7C, the stand for a mobile terminal according to the first embodiment of this invention includes the placement portion 10, and the pair of support leg portions 20 and the pair of brace portions 30, each serving as a support portion, and the shoulder belt holding portion 71.

The placement portion 10 has a plate-like shape, and includes a front surface 10f and a rear surface 10r. The mobile terminal 600 is placed on the front surface 10f under a state in which the hand belt 671 and the shoulder belt 680 are attached to the mobile terminal 600. The rear surface 10r is positioned on a side opposite to the front surface 10f.

The support leg portions 20 and the brace portions 30 support the placement portion 10 so that the mobile terminal 600 is placed on the placement portion 10 under a backwardly inclined state.

As illustrated in FIG. 2A and FIG. 2B, the shoulder belt holding portion 71 is provided to the rear surface 10r of the placement portion 10. The shoulder belt holding portion 71 has a holding space portion 71S (FIG. 4A, FIG. 4B) having a shape that is recessed in a direction toward a lower side of the placement portion 10, in which at least part of the shoulder belt 680 for the mobile terminal 600 placed on the placement portion 10 is placed. Specifically, inside the holding space portion 71S, the folded shoulder belt 680 is held.

As illustrated in FIG. 4A to FIG. 4C, the shoulder belt holding portion 71 includes a mounting portion 71a, a bottom portion 71b, and an upright portion 71c. The mounting portion 71a is mounted to the rear surface 10r in parallel thereto to define a front wall surface of the holding space portion 71S. The bottom portion 71b extends from a lower end of the mounting portion 71a in a direction toward a rear side of the placement portion 10 to define a bottom surface of the holding space portion 71S. The upright portion 71c extends from a rear end of the bottom portion 71b in a direction toward an upper side of the placement portion 10 to define a rear wall surface of the holding space portion 71S. The rear surface 10r of the placement portion 10 and a principal surface of the mounting portion 71a are present on the same plane.

A distance between the front wall surface and the rear wall surface of the holding space portion 71S is the same as or slightly larger than an assumed thickness of the folded shoulder belt 680. In FIG. 2A and FIG. 2B, the shoulder belt 680 is folded in five layers.

Four front ribs 71d are formed on the mounting portion 71a, which serves as the front wall surface of the holding space portion 71S, at intervals in a width direction of the placement portion (specifically, the width direction W of the stand). Each of the front ribs 71d formed at the four positions projects toward the upright portion 71c, which serves as the rear wall surface of the holding space portion 71S, and extends in the vertical direction of the placement portion 10.

Further, three rear ribs 71e are formed at three positions on the upright portion 71c, which serves as the rear wall surface of the holding space portion 71S, at intervals in the width direction of the placement portion 10 and arranged alternately with the front ribs 71d (arranged in a zig-zag pattern). Each of the rear ribs 71e formed at the three positions projects toward the mounting portion 71a, which serves as the front wall portion of the holding space portion 71S, and extends in the vertical direction of three placement portion 10.

The four front ribs 71d and the three rear ribs 71e prevent the shoulder belt 680 held between the mounting portion 71a and the upright portion 71c from being easily released from the holding space portion 71S.

The front ribs 71d formed on a surface of the mounting portion 71a and the rear ribs 71e formed on the upright portion 71c may be omitted. The bottom portion 71b may be directly mounted to the rear surface 10r of the placement portion 10 without providing the mounting portion 71a. In this case, the rear surface 10r of the placement portion 10 defines the front wall surface of the holding space portion 71S. Further, in this case, the four front ribs 71d, which are formed on the surface of the mounting surface 71a, are formed on the rear surface 10r of the placement portion 19, which is opposed to an inner surface of the upright portion 71c, instead.

Referring to FIG. 5 and FIG. 6A to FIG. 6C, the placement portion 10 has an approximately plate-like shape, and includes a terminal placement region 110 and a belt accommodating recessed portion 116, which are formed on the front surface 10f. The terminal placement region 110 supports a back surface of the mobile terminal 600 placed on the placement portion 10. The belt accommodating recessed portion 116 has a recessed shape with respect to the terminal placement region 110, and is configured to accommodate the hand belt 671 for the mobile terminal 600 placed on the placement portion 10 therein. Actually, the back surface of the mobile terminal 600 is supported not on the terminal placement region 110 itself but on abutment surfaces of abutment portions formed on the terminal placement region 110.

The belt accommodating recessed portion 116 extends along the width direction of the placement portion 10 (specifically, the width direction W of the stand) so that the hand belt 671 corresponds to the mobile terminal 600.

The terminal placement region 110 includes a second placement region 112 and a first placement region 111 which are arranged in the vertical direction of the placement portion 10 through intermediation of the belt accommodating recessed portion 116 therebetween. The first placement region 111 is positioned below the belt accommodating recessed portion 116. Meanwhile, the second placement region 112 is positioned above the belt accommodating recessed portion 116. A length of the second placement region 112 in the width direction is shorter than a length of the first placement region 111 in the width direction. With this configuration, right and left ends of the mobile terminal 600 placed on the stand can be gripped to easily remove the mobile terminal 600 placed on the stand. If the belt accommodating recessed portion 116 is not formed between the first placement region 111 and the second placement region 112 to prevent from dividing therebetween, the first placement region 111 and the second placement region 112 form the same plane. A planar shape of the belt accommodating recessed portion 116 has a gradually increasing width in an extending direction of the belt accommodating recessed portion 116 (width direction of the placement portion 10) so as to be away from both ends.

A sectional shape of the belt accommodating recessed portion 116, which is perpendicular to the extending direction of the belt accommodating recessed portion 116 (width direction of the placement portion 10), is curved to be convex backward in the depth direction D of the placement portion 10. In this example, a depth of the belt accommodating recessed portion 116 gradually increases in the extending direction of the belt accommodating recessed portion 116 (width direction of the placement portion 10) so as to be away from both ends. A depth of the recessed surface at an end of each side surface of the placement portion 10 is ensured to be larger than a thickness of the hand belt 671.

Further, the belt accommodating recessed portion 116 extends across the entire width of the placement portion 10 and has a slightly larger width than a width of the hand belt 671 at both ends in the extending direction of the belt accommodating recessed portion 116 (width direction of the placement portion 10).

The placement portion 10 is configured so as to correspond to the mobile terminal 600 in a state in which the hand belt 671 wrapped with the pad 672. (FIG. 8B and FIG. 9D) is attached to the mobile terminal 600. Specifically, the placement portion 10 further includes a pad accommodating opening port 117. The pad accommodating opening port 117 has a more deeply recessed shape than the recessed shape of the belt accommodating recessed portion 116 and serves as a pad accommodating recessed portion configured to accommodate the pad 672 for the hand belt 671 for the mobile terminal 600 placed on the placement portion 10 therein. In this example, the pad accommodating opening port 117 has a through-hole shape penetrating a placement portion 10. The pad accommodating opening port 117 has an opening area that allows passage of the pad 672 for the hand belt 671 therethrough. In this invention, the pad accommodating recessed portion may be a recessed portion with a closed end instead of having a through-hole shape as in this example. The placement portion 10 includes a pad support wall portion 117e (FIG. 6B). The pad support wall portion 117e extends from a lower side of the pad accommodating opening port 117 in the direction toward the rear side of the placement portion 10, and is configured to support the pad 672 for the mobile terminal 600 placed on the placement portion 10. The placement portion 10 further includes a terminal accommodating portion 102 formed on a lower part of the front surface 10f. The terminal accommodating portion 102 has a pocket-like shape and is configured to accommodate and support a lower end of the mobile terminal 600 placed on the placement portion 10. As illustrated in FIG. 6B, the probe-type contact pins 62 to be brought into contact with the above-mentioned contacts 662 (FIG. 9D) provided to the lower end of the mobile terminal 600 are provided inside the terminal accommodating portion 102. Further, besides the above-mentioned probe-type contact pins 62, the placement portion 10 includes a charging circuit (not shown), a connector to be connected to a cable connector from an alternating current (AC) adaptor (not shown), and a plurality of connectors for signal input and output (not shown). The charging circuit is built in the placement portion 10.

Further, the placement portion 10 includes a placed-item retaining portion 103 (FIG. 5), a retaining claw 104 (FIG. 5), and the rear cover 105 (FIG. 6C). The placed-item retaining portion 103 and the retaining claw 104 are provided to an upper side of the front surface 10f, and are configured to retain an upper end of the mobile terminal 600 having the lower end accommodated in the terminal accommodating portion 102 in a releasable manner. The retaining claw 104 is openable and closeable. The rear cover 105 is mounted removably to the rear surface 10f. As illustrated in FIG. 7C, the rear cover 105 has lead-out cutout portions 105ss on both sides and a lead-out cutout portion 105ls on a lower side so as to lead out the cable connectors (not shown) to be connected to the connectors provided to the placement portion 10.

As illustrated in FIG. 5, the first placement region 111 includes an abutment portion 121 and a pair of abutment portions 122, which are brought into abutment against the mobile terminal 600 when the mobile terminal 600 is placed on the stand. The abutment portion 121 has an abutment surface 121f to be brought into abutment against the mobile terminal 600, whereas each of the pair of abutment portions 122 has an abutment surface 122f to be brought into abutment against the mobile terminal 600. The abutment portion 121 has two convex portions 121p to be engaged with two recessed portions 600d (FIG. 8B) formed on the mobile terminal 600 to prevent the placed mobile terminal 600 from being easily removed upward. Meanwhile, the second placement region 112 includes a pair of abutment portions 123 to be brought into abutment against the mobile terminal 600 when the mobile terminal 600 is placed on the stand. Each of the pair of abutment portions 123 has an abutment portion 123f to be brought into abutment against the mobile terminal 600 and an extended portion 123e being parallel to the front surface 10f. The abutment portions are formed on the first placement portion 111 and the second placement portions 112 to form a clearance between the placed mobile terminal 600 and the front surface 10f so as to improve a heat dissipation property of the mobile terminal 600 while the mobile terminal 600 is placed on the stand.

Referring to FIG. 7B, the pair of the support leg portions 20 include two leg portions. Each of the leg portions includes a plurality of receiving seats 201, a plurality of conical hole portions 202, and support leg turning shafts 210. The leg portions are coupled to each other through the support leg coupling portion 207. A support leg coupling recessed portion 208 is a recessed portion formed on the support leg coupling portion 207. An intermediate plate 209 is provided to the plurality of receiving seats 201 of each of the leg portions.

Referring to FIG. 7A, the pair of the brace portions 30 include two brace portions. Each of the brace portions includes an anchor portion 301 and an urging stud 302. The anchor portion 301 projects from each distal end 30D. The anchor portion 301 has a recessed portion 309. Each of the brace end portions includes brace portion turning shafts 310 being turning shafts for the corresponding brace portion. The two brace portions are coupled to each other through a brace coupling portion 307. The brace coupling recessed portion 308 is a recessed portion formed on the brace coupling portion 307. The urging stud 302 is provided to an outer surface 30s that faces an inner surface 20s of each of the leg portions of the pair of support leg portions 20 so as to be located in the vicinity of the distal end 30D. The urging stud 302 is urged by a coil spring (not shown) so as to project outward in the width direction of the placement portion 10. The urging stud 302 includes a semi-spherical distal end 302t and a flange portion 302f. The flange portion 302f is formed at a proximal end of the semi-spherical distal end 302t. When the anchor portion 301 of each of the brace portions is received by any of the plurality of receiving seats 201 of the corresponding leg portion of the pair of support leg portions 20, the urging stud 302 is inserted into the conical hole portion 202 corresponding to the receiving seat 201.

Referring to FIG. 7B again, each of the leg portions of the pair of support leg portion 20 further includes a rib 203. The rib 203 projects inward in the width direction of the placement portion 10 from an end side of the inner surface 20s, which is adjacent to an upper surface 20u, and is extended in a longitudinal direction. The rib 203 has a cutout portion (cutout rib) 204 formed in the vicinity of each of a proximal end 20P of each of the leg portions of the pair of support leg portions 20. The rib 203 is configured to prevent departure of the urging stud 302 of each of the brace portions of the pair of brace portion 30 from the inner surface 20s while the urging stud 302 is sliding on the inner surface 20s of the brace end portion. Each of the leg portions of the pair of support leg portion 20 further includes an anchor accommodating portion 205 and a conical hole portion for folding 206, as illustrated in FIG. 7B. By disengaging the semi-spherical distal end 302t of the urging stud 302 of each of the brace portions of the pair of brace portion 30 through the cutout portion 204 of each of the leg portions of the pair of support leg portion 20, the pair of brace portions 30 and the pair of support leg portions 20 can be separated from each other. Thus, the pair of brace portions 30 and the pair of support leg portions 20 can be turned independently of each other to be folded in parallel to the rear surface 10f of the placement portion 10. The anchor accommodating portion 205 is formed on the upper surface 20u of each of the leg portions of the pair of support leg portion 20. The anchor accommodating portion 205 has a recessed shape so as to be able to accommodate, when the pair of support leg portions 20 is folded in parallel to the rear surface 10r of the placement portion 10, the anchor portion 301 of each of the brace portions of the pair of brace portion 30 that is similarly folded in parallel to the rear surface 10r of the placement portion 10. The conical hole portion for folding 206 is formed on the inner surface 20s of each of the leg portions of the pair of support leg portion 20 so as to correspond to the anchor accommodating portion 205.

The placement portion 10 has support leg portion turning shaft holes 132 and brace portion turning shaft holes 133, which are formed in the rear surface 10r, as illustrated in FIG. 6A. The support leg portion turning shafts 210 are accommodated in the support leg portion turning shaft holes 132. Whereas the brace portion turning shafts 310 are accommodated in the brace portion turning shaft holes 133.

The stand of this invention is configured to support the mobile terminal 600 placed on the placement portion 10 under a state of being inclined backwardly in the depth direction D by a lower end 10L of the placement portion 10 and distal ends 20D of the leg portions of the pair of support leg portion 20. In particular, an angle of the pair of support leg portions 20 with respect to the placement portion 10 can be changed in accordance with the receiving seats 201 of the plurality of receiving seats 201 of the pair of support leg portions 20, which receive the anchor portions 301 of the pair of brace portions 30. In this manner, an angle of inclination of the mobile terminal 600 placed on the placement portion 10 can be changed.

The stand of this invention is configured to lay the mobile terminal 600 placed on the placement portion 10 flat on a table (not shown) by folding the pair of support leg portions 20 and the pair of brace portions 30 in parallel to the rear surface 10f of the placement portion 10 after disengaging the pair of brace portions 30 from the pair of support leg portions 20. Similarly, the mobile terminal 600 can be placed on the placement portion 10, which is hung on a wall (not shown).

According to the stand of the first embodiment described above, when the mobile terminal 600 is placed on the stand under a state in which the shoulder belt 680 is attached to the mobile terminal 600, work for adjusting a posture of the shoulder belt, specifically, handling of the shoulder belt can easily be performed in comparison to the related art disclosed in Japanese Patent (JP-B) No. 6198093.

Second Embodiment

A stand for a mobile terminal according to a second embodiment of this invention differs from the stand according to the first embodiment in structure of the shoulder belt holding portion. A configuration other than the structure of the shoulder belt holding portion is the same as the configuration of the first embodiment. Therefore, the drawings and the description of the first embodiment are used in common in this embodiment, and a detailed description thereof is omitted.

Referring to FIG. 10A to FIG. 10E, the stand for a mobile terminal according to the second embodiment of this invention includes the placement portion 10, and the pair of support leg portions 20 and the pair of brace portions 30 (FIG. 2A and FIG. 2B), each of which serves as a support portion, and the shoulder belt holding portion 72. Each of two abutment portions 123' of the stand for a mobile terminal according to the second embodiment does not include an extended portion.

The shoulder belt holding portion 72 is provided in a recessed portion 10rd, which is formed on the rear surface 10r of the placement portion 10 so as to be recessed forward. The shoulder belt holding portion 72 has a holding space portion 72S having a shape recessed in the direction toward the lower part of the placement portion 10. In the shoulder belt holding portion 72, at least part of the shoulder belt 680 for the mobile terminal 600 placed on the placement portion 10 is placed. Specifically, the folded shoulder belt 680 is held in the holding space portion 72S.

More specifically, as illustrated in FIG. 10A, FIG. 10B, and FIG. 10E, the shoulder belt holding portion 72 includes a mounting portion 72a, a bottom portion 72b, and an upright portion 72c. The mounting portion 72a is mounted in parallel to the recessed portion 10rd formed on the rear surface 10r and defines a front wall surface of the holding space portion 72S in cooperation with the rear surface 10r. The bottom portion 72b is mounted to a lower end of the mounting portion 72a so as to be turnable about a turning shaft 72bx extending in the width direction of the placement portion 10 (specifically, the width direction W of the stand of this invention) to define a bottom surface of the holding space portion 72S. The upright portion 72c is mounted to a rear end of the bottom portion 72b so as to be turnable about a turning shaft 72cx extending in the width direction of the placement portion 10 to define a rear wall surface of the holding space portion 72S.

A distance between the front wall surface and the rear wall surface of the holding space portion 72S is the same as or slightly larger than an assumed thickness of the folded shoulder belt 680.

When the shoulder belt holding portion 72 is not used or the mobile terminal 600 without the shoulder belt is placed on the stand, the bottom portion 72b and the upright portion 72c are fumed to be folded in parallel to the rear surface 10r as illustrated in FIG. 10C and FIG. 10D, thereby accommodating the shoulder belt holding portion 72 in the recessed portion 10rd. On this occasion, the bottom portion 72b and the upright portion 72c in a folded state are located on the same plane. The bottom portion 72b and the upright portion 72c, which are folded, are configured to lock a folded state so as not to easily be developed when a certain degree of impact is applied to the stand of this invention.

The bottom portion 72b may be mounted directly to the recessed portion 10rd formed on the rear surface 10r of the placement portion 10 without providing the mounting portion 72a. In this case, the rear surface 10r of the placement portion 10 defines the front wall surface of the holding space portion 72S. Further, the front ribs may be formed on the mounting portion 72a or the rear surface 10r of the placement portion 10, and the rear ribs may be formed on the upright portion 72c.

According to the stand of the second embodiment described above, when the mobile terminal 600 is placed on the stand under a state in which the shoulder belt 680 is attached to the mobile terminal 600, handling of the shoulder belt can easily be performed in comparison to the related art disclosed in Japanese Patent (JP-B) No. 6198093.

Third Embodiment

A stand for a mobile terminal according to a third embodiment of this invention differs from the stand according to the first embodiment and the second embodiment in structure of the shoulder belt holding portion. A configuration other than the structure of the shoulder belt holding portion is the same as the configuration of the first embodiment and the second embodiment. Therefore, the drawings and the description of the first embodiment and the second embodiment are used in common in this embodiment, and a detailed description thereof is omitted.

Referring to FIG. 11A to FIG. 11G, the stand for a mobile terminal according to the third embodiment of this invention includes the placement portion 10, and the pair of support leg portions 20 and the pair of brace portions 30 (FIG. 2A and FIG. 2B), which serve as a support portion, and the shoulder belt holding portion 73. Each of two abutment portions 123' of the stand for a mobile terminal according to the third embodiment does not include an extended portion.

The shoulder belt holding portion 73 has a holding space portion 73S having a shape recessed in the direction toward the lower part of the placement portion 10. In the shoulder belt holding portion 73, at least part of the shoulder belt 680 for the mobile terminal 600 placed on the placement portion 10 is placed. Specifically, the folded shoulder belt 680 is held in the holding space portion 73S.

More specifically, as illustrated in FIG. 11A, FIG. 11B, and FIG. 11E, the shoulder belt holding portion 73 includes a mounting portion 73a, a bottom portion 73b, and an upright portion 73c. The both ends of the mounting portion 73a are mounted removably into groove portions 10us formed on an upper part of the placement portion 10 to define a front wall surface of the holding space portion 73S. The bottom portion 73b is formed so as to extend from a lower end of the mounting portion 73a to define a bottom surface of the holding space portion 73S. The upright portion 73c is formed so as to extend from a rear end of the bottom portion 73b to define a rear wall surface of the holding space portion 73S.

A distance between the front wall surface and the rear wall surface of the holding space portion 7S is the same as or slightly larger than an assumed thickness of the folded shoulder belt 680.

When the shoulder belt holding portion 73 is not used or the mobile terminal 600 without the shoulder belt is placed on the stand, the shoulder belt holding portion 73 is placed on the placement portion 10 in the following configuration. Specifically, as illustrated in FIG. 11C, FIG. 11D, and FIG. 11F, after the both ends of the mounting portion 73a are removed from the groove portions 10us (FIG. 11G) of the placement portion 10, the mounting portion 73a, the bottom portion 73b, and the upright portion 73c are turned upside down. After orientations of the mounting portion 73a and the upright portion 73c are changed so that the upright portion 73c is oriented to the groove portions 10us, the end portions of the mounting portion 73a are inserted into the groove portions 10us of the placement portion 10. In this manner, the shoulder belt holding portion 73 is placed on the placement portion 10. When the shoulder belt holding portion 73 is placed on the placement portion 10, the shoulder belt holding portion 73 does not project from the rear surface 10r of the placement portion 10. Meanwhile, the shoulder belt holding portion 73 projects from the front surface 10f of the placement portion 10. A height of projection of the shoulder belt holding portion 73 from the front surface 10f is smaller than a height of projection of the abutment portion 121 and the pair of abutment portions 122 (FIG. 5). Therefore, the shoulder belt holding portion 73 does not obstruct the placement of the mobile terminal 600 on the placement portion 10.

The front ribs may be formed on the mounting portion 73a or the rear surface 10r of the placement portion 10, and the rear ribs may be formed on the upright portion 73c.

According to the stand of the third embodiment described above, when the mobile terminal 600 is placed on the stand under a state in which the shoulder belt 680 is attached to the mobile terminal 600, handling of the shoulder belt can easily be performed in comparison to the related art disclosed in Japanese Patent (JP-B) No. 6198093.

Fourth Embodiment

A stand for a mobile terminal according to a fourth embodiment of this invention differs from the stand according to the first embodiment to the third embodiment in structure of the shoulder belt holding portion. A configuration other than the structure of the shoulder belt holding portion is the same as the configuration of the first embodiment to the third embodiment. Therefore, the drawings and the description of the fourth embodiment to the third embodiment are used in common in this embodiment, and a detailed description thereof is omitted.

Referring to FIG. 12A to FIG. 12C, the stand for a mobile terminal according to the fourth embodiment of this invention includes the placement portion 10, and the pair of support leg portions 20 and the pair of brace portions 30 (FIG. 2A and FIG. 2B), each of which serves as a support portion, and the shoulder belt holding portion 74. Each of two abutment portions 123' of the stand for a mobile terminal according to the fourth embodiment does not include an extended portion.

The shoulder belt holding portion 74 has a holding space portion 74S having a shape recessed in the direction toward the lower part of the placement portion 10. In the shoulder belt holding portion 74, at least part of the shoulder belt 680 for the mobile terminal 600 placed on the placement portion 10 is placed. Specifically, the folded shoulder belt 680 is held in the holding space portion 74S.

The shoulder belt holding portion 74 includes a pair of shoulder belt holding pieces 74L and 74R that is arranged at a given interval in the width direction of the placement portion 10 (specifically, the width direction W of the stand).

More specifically, each of the shoulder belt holding pieces 74L and 74R includes a bottom portion 74b and an upright portion 74c. The bottom portion 74b is mounted to the rear surface 10r of the placement portion 10 to define a bottom surface of the holding space portion 74S. The upright portion 74c is formed so as to extend from a rear end of the bottom portion 74b to define a rear wall surface of the holding space portion 74S. A front wall surface of the holding space portion 74S is defined by the rear surface 10r. Each of the bottom portion 74b and the upright portion 74c of each of the shoulder belt holding pieces 74L and 74R has a plate-like shape having a large width along the width direction of the placement portion 10.

A distance between the front wall surface and the rear wall surface of the holding space portion 74S is the same as or slightly larger than an assumed thickness of the folded shoulder belt 680.

Instead of being folded and held in the holding space portion 74S, the shoulder belt 680 may be held by being wound around the upright portions 74c of the shoulder belt holding pieces 74L and 74R.

According to the stand of the fourth embodiment described above, when the mobile terminal 600 is placed on the stand under a state in which the shoulder belt 680 is attached to the mobile terminal 600, handling of the shoulder belt can easily be performed in comparison to the related art disclosed in Japanese Patent (JP-B) No. 6198093.

Fifth Embodiment

A stand for a mobile terminal according to a fifth embodiment of this invention differs from the stand according to the first embodiment to the fourth embodiment in structure of the shoulder belt holding portion. A configuration other than the structure of the shoulder belt holding portion is the same as the configuration of the first embodiment to the fourth embodiment. Therefore, the drawings and the description of the first embodiment to the fourth embodiment are used in common in this embodiment, and a detailed description thereof is omitted.

Figure 13A:
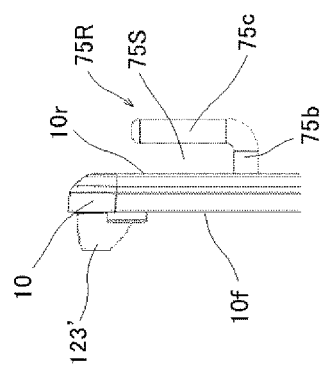
FIG. 13A, FIG. 13B, and FIG. 13C are a right side view, a top view, and a back view of a shoulder belt holding portion according to a fifth embodiment of this invention, respectively.
Figure 13B:
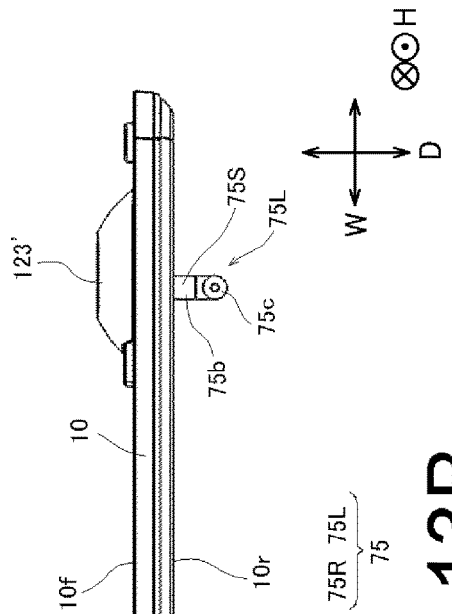
Figure 13C:
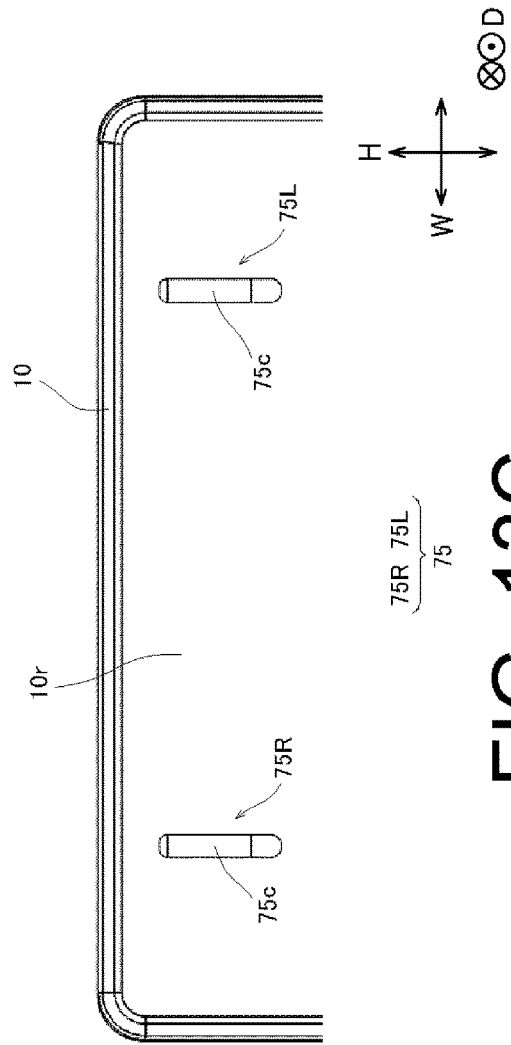

Referring to FIG. 13A to FIG. 13C, the stand for a mobile terminal according to the fifth embodiment of this invention includes the placement portion 10, and the pair of support leg portions 20 and the pair of brace portions 30 (FIG. 2A and FIG. 2B), each of which serves as a support portion, and the shoulder belt holding portion 75. Each of two abutment portions 123' of the stand for a mobile terminal according to the fifth embodiment does not include an extended portion.

The shoulder belt holding portion 75 has a holding space portion 75S having a shape recessed in the direction toward the lower part of the placement portion 10. In the shoulder belt holding portion 75, at least part of the shoulder belt 680 for the mobile terminal 600 placed on the placement portion 10 is placed. Specifically, the folded shoulder belt 680 is held in the holding space portion 75S.

The shoulder belt holding portion 75 includes a pair of shoulder belt holding pieces 75L and 75R that is arranged at a given interval in the width direction of the placement portion 10 (specifically, the width direction W of the stand).

More specifically, each of the shoulder belt holding pieces 75L and 75R includes a bottom portion 75b and an upright portion 75c. The bottom portion 75b is mounted to the rear surface 10r of the placement portion 10 to define a bottom surface of the holding space portion 75S. The upright portion 75c is formed so as to extend from a rear end of the bottom portion 75b to define a rear wall surface of the holding space portion 75S. A front wall surface of the holding space portion 75S is defined by the rear surface 10r. Each of the bottom portion 75b and the upright portion 75c of each of the shoulder belt holding pieces 75L and 75R have a round bar shape. Each of the bottom portion 75b and the upright portion 75c may have a polygonal bar shape.

A distance between the front wall surface and the rear wall surface of the holding space portion 75S is the same as or slightly larger than an assumed thickness of the folded shoulder belt 680.

Although each of the shoulder belt holding portions according to the first embodiment to the fourth embodiment holds the shoulder belt 680 under a folded state. However, the shoulder belt holding portion 75 of the stand of the fifth embodiment does not only hold the shoulder belt 680 in the folded state but also can hold the shoulder belt 680 that is wound around the bar-shaped upright portions 75c of the shoulder belt holding pieces 75L and 75R. Specifically, the stand according to the fifth embodiment can hold the shoulder belt 680 by winding the shoulder belt 680 instead of folding the shoulder belt 680. Thus, the shoulder belt 680 can more easily be handled.

According to the stand of the fifth embodiment described above, when the mobile terminal 600 is placed on the stand under a state in which the shoulder belt 680 is attached to the mobile terminal 600, handling of the shoulder belt can easily be performed in comparison to the related art disclosed in Japanese Patent (JP-B) No. 6198093.

Sixth Embodiment

A stand for a mobile terminal according to a sixth embodiment of this invention differs from the stand according to the first embodiment to the fifth embodiment in structure of the shoulder belt holding portion. A configuration other than the structure of the shoulder belt holding portion is the same as the configuration of the first embodiment to the fifth embodiment. Therefore, the drawings and the description of the first embodiment to the fifth embodiment are used in common in this embodiment, and a detailed description thereof is omitted.

Figure 14A:
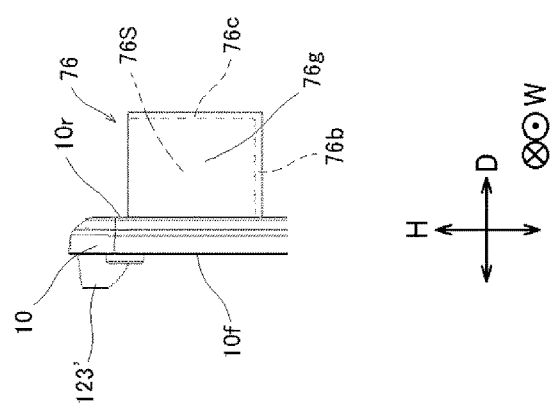
FIG. 14A, FIG. 14B, and FIG. 14C are a right side view, a top view, and a back view of a shoulder belt holding portion according to a sixth embodiment of this invention, respectively.
Figure 14B:
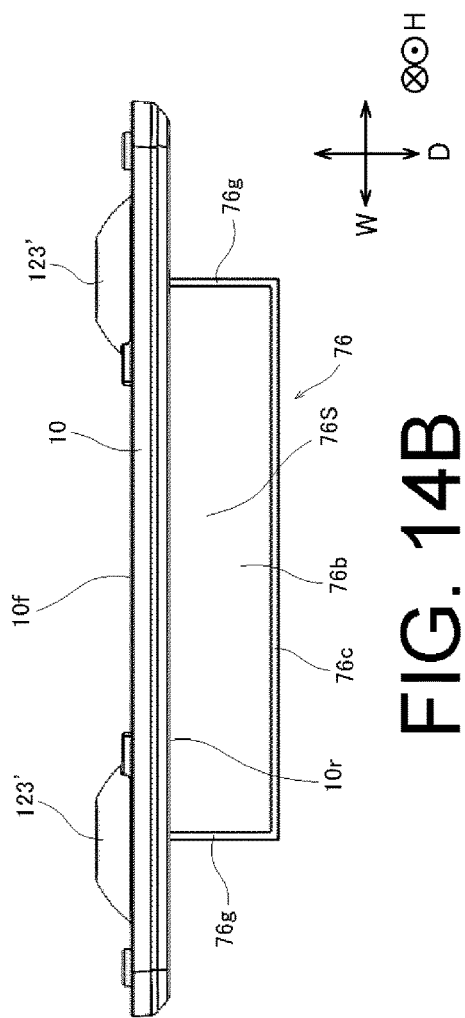
Figure 14C:
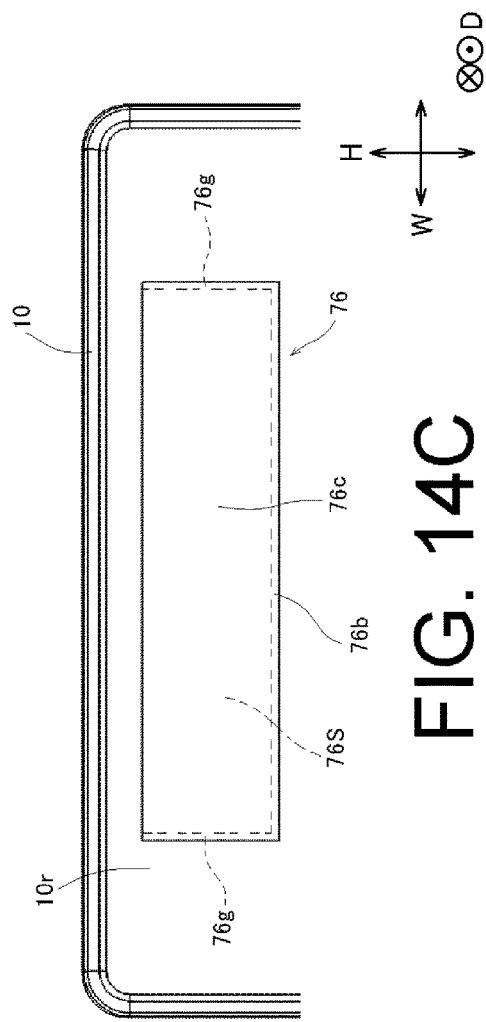

Referring to FIG. 14A to FIG. 14C, the stand for a mobile terminal according to the sixth embodiment of this invention includes the placement portion 10 and the pair of support leg portions 20 and the pair of brace portions 30 (FIG. 2A and FIG. 2B), each of which serves as a support portion, and the shoulder belt holding portion 76. Each of two abutment portions 123' of the stand for a mobile terminal according to the sixth embodiment does not include an extended portion.

The shoulder belt holding portion 76 has a holding space portion 76S having a shape recessed in the direction toward the lower part of the placement portion 10. In the shoulder belt holding portion 76, at least part of the shoulder belt 680 for the mobile terminal 600 placed on the placement portion 10 is placed. Specifically, the folded shoulder belt 680 is held in the holding space portion 76S.

More specifically, the shoulder belt holding portion 76 includes a bottom portion 76b, an upright portion 76c, and a pair of side plates 76g. The bottom portion 76b is mounted to the rear surface 10r of the placement portion 10 to define a bottom surface of the holding space portion 76S. The upright portion 76c is formed so as to extend from a rear end of the bottom portion 76b to define a rear wall surface of the holding space portion 76S. The pair of side plates 76g defines both ends of the holding space portion 76S in the width direction (specifically, the width direction W of the stand). In other words, the shoulder belt holding portion 76 has a rectangular box-like shape with an open upper end.

A distance between the rear surface 10r serving as the front wall surface of the holding space portion 76S and the upright portion 76c serving as the rear wall surface of the holding space portion 76S is larger than a width of the shoulder belt.

The shoulder belt holding portion 76 of the stand according to the sixth embodiment can not only hold the shoulder belt 680 in the folded state but also hold the shoulder belt 680 that is messily arranged (is not folded beautifully) or the shoulder belt 680 in a posture of lying in a thickness direction of the shoulder belt so as to accommodate the shoulder belt 680 therein. Specifically, the stand of the sixth embodiment can also hold the shoulder belt 680 without folding. Thus, the shoulder belt 680 can more easily be handled.

According to the stand of the sixth embodiment described above, when the mobile terminal 600 is placed on the stand under a state in which the shoulder belt 680 is attached to the mobile terminal 600, handling of the shoulder belt can easily be performed in comparison to the related art disclosed in Japanese Patent (JP-B) No. 6198093.

It should be noted that this invention is not limited to the first to sixth embodiments described above. For example, although the stand includes the support portion including the brace portion and the support leg portion, which has a variable support angle for the placement portion, the stand may include a support portion fixed at a predetermined angle.

Further, in the embodiments described above, although the stand includes the contact pins for connection to the contacts of the mobile terminal to charge the mobile terminal placed thereon and perform wired communication with other devices, the stand may perform only the wired communication with other devices or may only charge the mobile terminal. Alternatively, the stand is not required to include the contact pins for connection to the contacts of the mobile terminal and does not perform the wired communication with other devices. For example, the mobile terminal may be used alone or the mobile terminal may include a wireless portion to be used through wireless communication with other devices.

Further, in the embodiments described above, although the stand has the hand belt accommodating recessed portion with the opening port, the stand may have a single continuous placement surface without having the hand belt accommodating recessed portion, specifically, without having the first placement region or the second placement region.

What is claimed is:

1. A stand for a mobile terminal, comprising:
a placement portion having a plate-like shape, including a front surface on which a mobile terminal is to be placed under a state in which a shoulder belt is attached to the mobile terminal and a rear surface on a side opposite to the front surface;
a support portion configured to support the placement portion so that the mobile terminal placed on the placement portion is backwardly inclined; and
a shoulder belt holding portion, which is provided to the rear surface of the placement portion and has a holding space portion having a shape recessed in a direction toward a lower side of the placement portion so that at least part of the shoulder belt for the mobile terminal placed on the placement portion is placed therein.

2. The stand for a mobile terminal according to claim 1, wherein the shoulder belt holding portion includes:
a bottom portion, which extends from the rear surface in a direction toward a rear side of the placement portion to define a bottom surface of the holding space portion; and
an upright portion, which extends from a rear end of the bottom portion in a direction toward an upper side of the placement portion to define a rear wall surface of the holding space portion, and
wherein the rear surface is configured to define a front wall surface of the holding space portion.

3. The stand for a mobile terminal according to claim 2, wherein the shoulder belt holding portion further includes a mounting portion mounted in parallel to the rear surface, and
wherein the mounting surface is configured to define the front wall surface of the holding space portion in place of the rear surface.

4. The stand for a mobile terminal according to claim 3, wherein the mounting portion is mounted inside a recessed portion formed on the rear surface in parallel to the rear surface,
wherein the bottom portion is mounted to a lower end of the mounting portion so as to be turnable about a rotary shaft extending in a width direction of the placement portion,
wherein the upright portion is mounted to a rear end of the bottom portion so as to be turnable about a rotary shaft extending in the width direction of the placement portion, and
wherein the shoulder belt holding portion is configured to be accommodated in the recessed portion by turning the bottom portion and the upright portion to fold the bottom portion and the upright portion in parallel to the rear surface.

5. The stand for a mobile terminal according to claim 4, wherein a plurality of front ribs are formed on the front wall surface of the holding space portion at given intervals in a width direction of the placement portion,
wherein the plurality of front ribs project toward the rear wall surface of the holding space portion and extend in a vertical direction of the placement portion,
wherein a plurality of rear ribs are formed on the rear wall surface of the holding space portion at given intervals in the width direction of the placement portion so as to be arranged alternately with the plurality of front ribs, and
wherein the plurality of rear ribs project toward the front wall surface of the holding space portion and extend in the vertical direction of the placement portion.

6. The stand for a mobile terminal according to claim 4, wherein the shoulder belt holding portion includes a plurality of shoulder belt holding pieces arranged at given intervals in a width direction of the placement portion, and
wherein each of the bottom portion and the upright portion of each of the plurality of shoulder belt holding pieces has any one of a bar shape and a plate-like shape with a large width along the width direction of the placement portion.

7. The stand for a mobile terminal according to claim 3, wherein the mounting portion is inserted into groove portion formed on an upper part of the placement portion so as to be removable,
wherein the bottom portion is formed so as to extend from a lower end of the mounting portion,
wherein the upright portion is formed so as to extend from a rear end of the bottom portion, and
wherein the shoulder belt holding portion is configured to be placed on the placement portion by removing the mounting portion from the groove portion, turning the mounting portion, the bottom portion, and the upright portion upside down to change orientations of the mounting portion and the upright portion, and inserting the mounting portion into the groove portion again.

8. The stand for a mobile terminal according to claim 7, wherein a plurality of front ribs are formed on the front wall surface of the holding space portion at given intervals in a width direction of the placement portion,
wherein the plurality of front ribs project toward the rear wall surface of the holding space portion and extend in a vertical direction of the placement portion,
wherein a plurality of rear ribs are formed on the rear wall surface of the holding space portion at given intervals in the width direction of the placement portion so as to be arranged alternately with the plurality of front ribs, and
wherein the plurality of rear ribs project toward the front wall surface of the holding space portion and extend in the vertical direction of the placement portion.

9. The stand for a mobile terminal according to claim 7, wherein the shoulder belt holding portion includes a plurality of shoulder belt holding pieces arranged at given intervals in a width direction of the placement portion, and
wherein each of the bottom portion and the upright portion of each of the plurality of shoulder belt holding pieces has any one of a bar shape and a plate-like shape with a large width along the width direction of the placement portion.

10. The stand for a mobile terminal according to claim 7, wherein the shoulder belt holding portion further includes a pair of side plates, which defines both ends of the holding space portion in a width direction of the placement portion.

11. The stand for a mobile terminal according to claim 3, wherein a plurality of front ribs are formed on the front wall surface of the holding space portion at given intervals in a width direction of the placement portion,
wherein the plurality of front ribs project toward the rear wall surface of the holding space portion and extend in a vertical direction of the placement portion,
wherein a plurality of rear ribs are formed on the rear wall surface of the holding space portion at given intervals in the width direction of the placement portion so as to be arranged alternately with the plurality of front ribs, and
wherein the plurality of rear ribs project toward the front wall surface of the holding space portion and extend in the vertical direction of the placement portion.

12. The stand for a mobile terminal according to claim 3, wherein the shoulder belt holding portion includes a plurality of shoulder belt holding pieces arranged at given intervals in a width direction of the placement portion, and
wherein each of the bottom portion and the upright portion of each of the plurality of shoulder belt holding pieces has any one of a bar shape and a plate-like shape with a large width along the width direction of the placement portion.

13. The stand for a mobile terminal according to claim 3, wherein the shoulder belt holding portion further includes a pair of side plates, which defines both ends of the holding space portion in a width direction of the placement portion.

14. The stand for a mobile terminal according to claim 3, wherein the support portion includes:
a pair of support leg portions including two leg portions, each having a bar shape extending from a proximal end to a distal end and having the proximal end mounted to the rear surface of the placement portion so as to be turnable about a turning shaft provided along a width direction of the placement portion, the leg portions being arranged in the width direction of the placement portion and coupled to each other; and
a pair of brace portions including two brace portions, each having a bar shape extending from a proximal end to a distal end and having the proximal end mounted to the rear surface of the placement portion so as to be turnable about a turning shaft provided along the width direction of the placement portion, the brace end portions being arranged in the width direction of the placement portion and coupled to each other,
wherein the placement portion is supported by a lower end of the placement portion and the distal ends of the leg portions of the pair of support leg portions so that the mobile terminal placed on the placement portion is inclined backwardly,
wherein each of the brace portions of the brace portion includes an anchor portion projecting from the distal end of the corresponding brace portion,
wherein each of the leg portions of the pair of support leg portions includes a plurality of receiving seats formed on an upper surface that intersects with a turning direction and faces the corresponding one of the brace portions, the plurality of receiving seats, each having a recessed shape capable of receiving the anchor portion of the corresponding one of the brace portions, being arranged side by side in a longitudinal direction of the leg portions of the pair of support leg portions, and
wherein an angle of the support leg portion with respect to the placement portion is changeable in accordance with a position of the receiving seat of the plurality of receiving seats of each of the leg portions of the pair of support leg portions, which receives the anchor portion of a corresponding one of the brace portions of the pair of brace portions so that an angle of inclination of the mobile terminal placed on the placement portion is changeable.

15. The stand for a mobile terminal according to claim 2, wherein a plurality of front ribs are formed on the front wall surface of the holding space portion at given intervals in a width direction of the placement portion,
wherein the plurality of front ribs project toward the rear wall surface of the holding space portion and extend in a vertical direction of the placement portion,
wherein a plurality of rear ribs are formed on the rear wall surface of the holding space portion at given intervals in the width direction of the placement portion so as to be arranged alternately with the plurality of front ribs, and
wherein the plurality of rear ribs project toward the front wall surface of the holding space portion and extend in the vertical direction of the placement portion.

16. The stand for a mobile terminal according to claim 2, wherein the shoulder belt holding portion includes a plurality of shoulder belt holding pieces arranged at given intervals in a width direction of the placement portion, and
wherein each of the bottom portion and the upright portion of each of the plurality of shoulder belt holding pieces has any one of a bar shape and a plate-like shape with a large width along the width direction of the placement portion.

17. The stand for a mobile terminal according to claim 2, wherein the shoulder belt holding portion further includes a pair of side plates, which defines both ends of the holding space portion in a width direction of the placement portion.

18. The stand for a mobile terminal according to claim 2, wherein the support portion includes:
a pair of support leg portions including two leg portions, each having a bar shape extending from a proximal end to a distal end and having the proximal end mounted to the rear surface of the placement portion so as to be turnable about a turning shaft provided along a width direction of the placement portion, the leg portions being arranged in the width direction of the placement portion and coupled to each other; and
a pair of brace portions including two brace portions, each having a bar shape extending from a proximal end to a distal end and having the proximal end mounted to the rear surface of the placement portion so as to be turnable about a turning shaft provided along the width direction of the placement portion, the brace end portions being arranged in the width direction of the placement portion and coupled to each other,
wherein the placement portion is supported by a lower end of the placement portion and the distal ends of the leg portions of the pair of support leg portions so that the mobile terminal placed on the placement portion is inclined backwardly, wherein each of the brace portions of the brace portion includes an anchor portion projecting from the distal end of the corresponding brace portion, wherein each of the leg portions of the pair of support leg portions includes a plurality of receiving seats formed on an upper surface that intersects with a turning direction and faces the corresponding one of the brace portions, the plurality of receiving seats, each having a recessed shape capable of receiving the anchor portion of the corresponding one of the brace portions, being arranged side by side in a longitudinal direction of the leg portions of the pair of support leg portions, and wherein an angle of the support leg portion with respect to the placement portion is changeable in accordance with a position of the receiving seat of the plurality of receiving seats of each of the leg portions of the pair of support leg portions, which receives the anchor portion of a corresponding one of the brace portions of the pair of brace portions so that an angle of inclination of the mobile terminal placed on the placement portion is changeable.

19. The stand for a mobile terminal according to claim 1, wherein the support portion includes:

a pair of support leg portions including two leg portions, each having a bar shape extending from a proximal end to a distal end and having the proximal end mounted to the rear surface of the placement portion so as to be turnable about a turning shaft provided along a width direction of the placement portion, the leg portions being arranged in the width direction of the placement portion and coupled to each other; and a pair of brace portions including two brace portions, each having a bar shape extending from a proximal end to a distal end and having the proximal end mounted to the rear surface of the placement portion so as to be turnable about a turning shaft provided along the width direction of the placement portion, the brace end portions being arranged in the width direction of the placement portion and coupled to each other, wherein the placement portion is supported by a lower end of the placement portion and the distal ends of the leg portions of the pair of support leg portions so that the mobile terminal placed on the placement portion is inclined backwardly, wherein each of the brace portions of the brace portion includes an anchor portion projecting from the distal end of the corresponding brace portion, wherein each of the leg portions of the pair of support leg portions includes a plurality of receiving seats formed on an upper surface that intersects with a turning direction and faces the corresponding one of the brace portions, the plurality of receiving seats, each having a recessed shape capable of receiving the anchor portion of the corresponding one of the brace portions, being arranged side by side in a longitudinal direction of the leg portions of the pair of support leg portions, and wherein an angle of the support leg portion with respect to the placement portion is changeable in accordance with a position of the receiving seat of the plurality of receiving seats of each of the leg portions of the pair of support leg portions, which receives the anchor portion of a corresponding one of the brace portions of the pair of brace portions so that an angle of inclination of the mobile terminal placed on the placement portion is changeable.

20. The stand for a mobile terminal according to claim 1, wherein the placement portion is configured so as to be compatible with the mobile terminal under a state in which a hand belt configured to allow a user to insert a hand therein is attached to a rear surface of the mobile terminal, and wherein the placement portion has a belt accommodating recessed portion, which has a shape recessed in a direction perpendicular to the front surface with respect to the front surface to accommodate the hand belt for the mobile terminal placed on the placement portion.

* * * * *

UNITED STATES PATENT AND TRADEMARK OFFICE
CERTIFICATE OF CORRECTION

PATENT NO. : 10,469,641 B2
APPLICATION NO. : 16/178721
DATED : November 5, 2019
INVENTOR(S) : Manabu Hayahi and Katsutoshi Hayashi Page 1 of 1

It is certified that error appears in the above-identified patent and that said Letters Patent is hereby corrected as shown below:

On the Title Page

Column 1, (73) Assignee, Line 1; Delete "Kanagawa-shi," and insert --Kawasaki-shi,-- therefor In the Specification Column 4, Description of the Embodiments, Line 23; Before "an", insert --or--

Column 6, Description of the Embodiments, Line 59; Delete "672." and insert --672-- therefor Column 9, Description of the Embodiments, Line 14; Delete "132. Whereas" and insert --132, whereas-- therefor Column 10, Description of the Embodiments, Line 34; Delete "fumed" and insert --turned-- therefor Column 14, Description of the Embodiments, Line 11; After "10", insert --,--

Signed and Sealed this
Twenty-fourth Day of November, 2020

Andrei Iancu
*Director of the United States Patent and Trademark Office*